United States Patent
York

(10) Patent No.: US 6,683,341 B1
(45) Date of Patent: Jan. 27, 2004

(54) VOLTAGE-VARIABLE CAPACITOR WITH INCREASED CURRENT CONDUCTING PERIMETER

(75) Inventor: Robert A. York, Santa Barbara, CA (US)

(73) Assignee: Agile Materials & Technologies, Inc., Goleta, CA (US)

( * ) Notice: Subject to any disclaimer, the term of this patent is extended or adjusted under 35 U.S.C. 154(b) by 0 days.

(21) Appl. No.: 10/144,185

(22) Filed: May 10, 2002

Related U.S. Application Data

(60) Provisional application No. 60/337,364, filed on Dec. 5, 2001.

(51) Int. Cl.$^7$ ........................................... H01L 217/108
(52) U.S. Cl. .................... 257/312; 257/295; 257/306; 257/307; 257/308; 257/303; 257/300; 257/309; 257/296; 257/311; 438/379; 438/387; 361/303
(58) Field of Search ........................... 257/29.344, 312, 257/295, 307, 308, 303, 532, 306, 300, 309, 296, 311; 438/379, 387; 361/303

(56) References Cited

U.S. PATENT DOCUMENTS

| | | | |
|---|---|---|---|
| 5,721,700 A | 2/1998 | Katoh | |
| 6,077,737 A | 6/2000 | Yang et al. | |
| 6,300,654 B1 | 10/2001 | Corvasce et al. | |
| 6,383,858 B1 * | 5/2002 | Gupta et al. | 438/238 |
| 6,432,794 B1 * | 8/2002 | Lou | 438/396 |
| 6,452,776 B1 * | 9/2002 | Chakravorty | 439/320 |

OTHER PUBLICATIONS

Taylor, T.R. et al., "Impact of thermal strain on the dielectric constant of sputtered barium strontium titanate thin films," *Applied Physics Letters*, vol. 80, No. 11, Mar. 18, 2002, pp. 1978–80.

Taylor, T.R. et al., "Optimization of RF Sputtered Barium Strontium Titanate (BST) Thin Films for High Tunability," presented at MRS Conference, Fall 1999, 2 pages [online], [retrieved on 2003–06–24]. Retrieved from the Internet <URL: http://my.ece.ucsb.edu/yorklab/Publications/pubs.htm>.

Taylor, T.R. et al., "RF Sputtered High Tunability Barium Strontium Titanate (BST) Thin Films for High Frequency Applications," presented at ISIF 2000 Conference, Aachen, Germany, Mar. 2000, 2 pages [online], [retrieved on Jun. 24, 2003]. Retrieved from the Internet <URL: http://my.ece.ucsb.edu/yorklab/Publications/pubs.htm>.

York, R. et al. "Microwave Integrated Circuits using Thin–Film BST," presented at ISAF Conference, Honolulu, Hawaii, Jul. 21–Aug. 2, 2000, 6 pages [online], [retrieved on Jun. 24, 2003]. Retrieved from the Internet <URL: http://my.ece.ucsb.edu/yorklab/Publications/pubs.html>.

York, Robert A. et al., "Synthesis and Characterization of $(Ba_xSr_{1-x})Ti_{1+y}O_{3+z}$ Thin Films and Integration into Microwave Varactors and Phase Shifters," *Journal of Integrated Ferroelectrics*, vol. 34, Apr. 10, 2000, pp. 177–188.

(List continued on next page.)

Primary Examiner—Eddie Lee
Assistant Examiner—Junghwa Im
(74) Attorney, Agent, or Firm—Fenwick & West LLP

(57) ABSTRACT

A parallel-plate, voltage-variable capacitor is designed to have an increased current conducting perimeter relative to its area. In one approach, the perimeter is increased by changing the shape of the plates. In another approach, the varactor is implemented by a number of disjoint plates, which are coupled in parallel.

20 Claims, 6 Drawing Sheets

OTHER PUBLICATIONS

York, Robert A. et al., "Thin–Film Phase Shifters for Low–Cost Phased Arrays," presented at Workshop on Affordability and Cost Reduction for Radar Systems, Huntsville, Alabama, Apr. 2000 and at URSI Conference, Salt Lake City, Utah, Jul. 2000, 10 pages [online], [retrieved on Jun. 24, 2003]. Retrieved from the Internet <URL: http://my.ece.ucsb.edu/yorklab/Publications/pubs.htm>.

Acikel, Baki et al., "A New High Performance Phase Shifter using ($Ba_xSr_{1-x}$ $TiO_3$ Thin Films," *IEEE Microwave and Wireless Components Letters*, vol. 12, No. 7, Jul. 2002, pp. 237–239.

Erker, ErichG. et al., "Monolithic Ka–Band Phase Shifter Using Voltage Tunable BaSrTiO3 Parallel Plate Capacitors," *IEEE Microwave and Guided Wave Letters*, vol. 10, No. 1, Jan. 2000, pp. 10–12.

Liu, Yu et al., "$BaSrTioO_3$ Interdigitated Capacitors for Distributed Phase Shifter Applications," *IEEE Microwave and Guided Wave Letters*, vol. 10, No. 11, Nov. 2000, pp. 448–450.

Liu, Yu et al., "High–performance and Low–cost Distributed Phase Shifters Using Optimized $BaSrTiO_3$ Interdigitated Capacitors," Electrical and Computer Engineering Dept., Materials Dept., University of California at Santa Barbara, Santa Barbara, CA 93106, 14 pages [online], [retrieved on Jun. 24, 2003]. Retrieved from the Internet <URL: http://my.ece.ucsb.edu/yorklab/Publications/pubs.htm>.

Padmini, P. et al., "Realization of High Tunability Barium Strontium Titanate Thin Films by RF Magnetron Sputtering," *Applied Physics Letters*, vol. 75, Nov. 1999, pp. 3186–3188.

Serraiocco, J. et al., "Tunable Passive Integrated Circuits Using BST Thin FIlms," presented at IFFF 2002, International Joint Conference on the Applications of Ferroelectrics, Kyoto, Japan, May 2002, 10 pages [online], [retrieved on Jun. 24, 2003]. Retrieved from the Internet <URL: http://my.ece.ucsb.edu/yorklab/Publications/pubs.htm>.

* cited by examiner

VOLTAGE-VARIABLE CAPACITOR WITH INCREASED CURRENT CONDUCTING PERIMETER

CROSS-REFERENCE TO RELATED APPLICATION

This application claims priority under 35 U.S.C. §119(e) to U.S. Provisional Patent Application Ser. No. 60/337,364, "Ferroelectric Varactor Design," by Robert A. York, filed Dec. 5, 2001. The subject matter of the foregoing is incorporated herein by reference in its entirety.

BACKGROUND OF THE INVENTION

1. Field of the Invention

This invention generally relates to voltage-variable capacitors (varactors) of a parallel plate design.

2. Description of the Related Art

Capacitors are a basic building block for electronic circuits and voltage-variable capacitors (varactors) have the added flexibility that their capacitance can be tuned by changing a bias voltage across the capacitor. Dielectric materials which have a permittivity that depends on the applied electric field can be used to form such varactors. Varactors have an added advantage that they can be easily integrated with other components, particularly if the dielectric layer is a thin film. One common approach to voltage-variable varactors is the "parallel-plate" configuration, in which the voltage-variable dielectric is sandwiched between two electrodes. For example, in an integrated varactor, one electrode may be a bottom conducting layer, the dielectric may be a ferroelectric thin film deposited over the bottom electrode, and the top electrode may be a metal layer.

In the parallel-plate configuration, the capacitance of the varactor is determined in part by the area of overlap of the top electrode, the dielectric layer and bottom electrode. For convenience, this area shall be referred to as the active region of the varactor. In many designs, the active region is determined mainly by the size and shape of the two electrodes; the dielectric layer is made large enough so that it does not additionally limit the active region. Thus, the varactor is designed for a specific capacitance by adjusting the lateral dimensions of the top and/or bottom electrodes. The active region typically is square-shaped (or close to square-shaped) although other shapes, including circular, may also be used.

The electrodes have some finite resistance. This resistance leads to loss and also limits the operating bandwidth of the varactor. For example, the electrode resistance in series with the varactor's capacitance forms an RC combination with a certain time constant. Higher resistance means longer RC time constant and lower cutoff frequency. The resistance typically is reduced by increasing the thickness of the metal films forming the electrodes. However, limitations in the fabrication process can place an upper limit on the maximum thickness of the electrodes. Increasing the thickness of the electrodes can also be costly since, for various reasons, the bottom electrode may be made from an expensive refractory metal such as platinum, palladium, iridium and related compounds. For these reasons, the electrode thicknesses are constrained. This, in turn, limits the sheet resistance and the current handling capacity of the varactor as a result of effects such as electromigration and/or Joule-heating. Hence, the conventional parallel-plate design is not particularly well suited for implementing low-loss, high-current varactors.

SUMMARY OF THE INVENTION

The present invention overcomes the limitations of the related art by providing a parallel-plate varactor in which the current conducting perimeter of the active region for at least one electrode is increased relative to the area of the active region. The current conducting perimeter is that portion of the geometrical perimeter which supports current flow between the active region and the rest of the electrode. In one approach, the current conducting perimeter is increased by changing the shape of the active region, for example by using a long skinny active region rather than a square one. In another approach, the active region is implemented by a number of disjoint subregions, termed "cells," which are coupled in parallel. The cells together have the area required to implement a certain capacitance but subdividing the active region into cells increases the total current conducting perimeter.

Increasing the current conducting perimeter addresses the problems with conventional parallel-plate designs. The increased perimeter results in more paths for current to move between the dielectric layer and the bulk regions of the electrodes, thus reducing the resistance of the electrodes. This same effect also increases the current handling capacity of the varactor. Furthermore, these gains are achieved without having to increase the electrode thickness, although doing so may result in even further gains.

In one implementation, a parallel plate varactor includes a bottom electrode, a top electrode and a dielectric layer sandwiched between the top electrode and the bottom electrode. The permittivity of the dielectric layer varies according to an electric field applied to the dielectric layer. The active region of the varactor is defined by an overlap between the top electrode, the dielectric layer and the bottom electrode. For at least one of the electrodes, the resistance of the active region of the electrode is significantly higher than a resistance of a bulk region of the electrode. Furthermore, the active region has a lateral area A, the electrode has a current conducting perimeter P, and a ratio R of the perimeter P to a square root of the area A is at least 2.0.

In one embodiment, the dielectric layer is a voltage-variable thin film (e.g., based on a ferroelectric material) and the high resistance electrode is a refractory metal. Examples of voltage-variable ferroelectric thin films include barium titanate, strontium titanate and barium strontium titanate. Examples of refractory metals include platinum, palladium, iridium, nickel, tungsten, or ruthenium.

In one particular aspect of the invention, the active region includes one or more rectangular cells. The active region of the bottom electrode has a higher sheet resistance than the active region of the top electrode. For example, platinum may be used for the bottom electrode, barium strontium titanate as the dielectric layer and gold for the top electrode. Furthermore, for each cell, the current conducting perimeter of the bottom electrode includes at least three sides of the cell and the current conducting perimeter of the top electrode includes the fourth side of the cell.

BRIEF DESCRIPTION OF THE DRAWING

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1A:
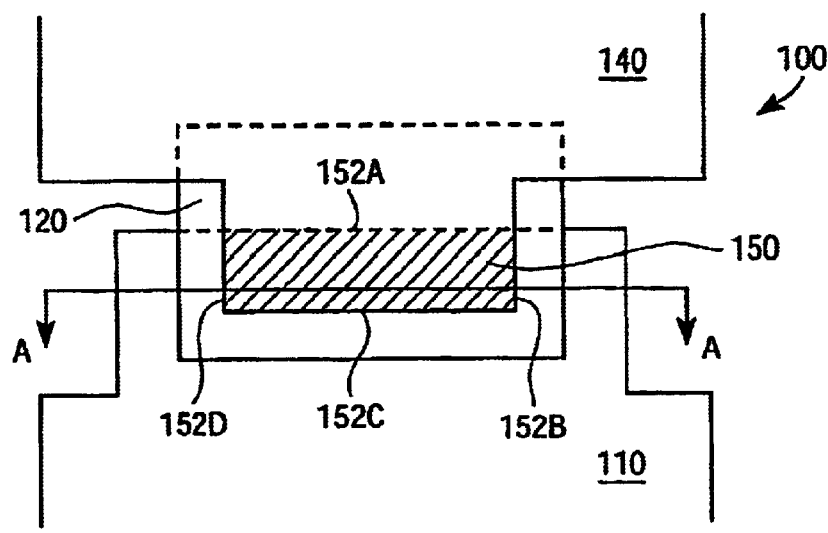
FIGS. 1A and 1B are a top view and cross-sectional view, respectively, of a varactor according to the present invention.
Figure 1B:
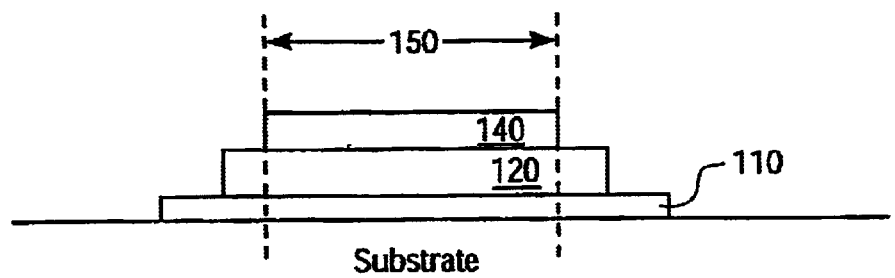

FIGS. 1A and 1B are a top view and cross-sectional view, respectively, of a voltage-variable capacitor (varactor) 100 according to the present invention. The varactor 100 includes a bottom electrode 110, a top electrode 140 and a layer 120 of dielectric material sandwiched between the top electrode and the bottom electrode. The top electrode 140, the dielectric layer 120 and the bottom electrode 110 form a parallel plate capacitor. The active region 150 of the capacitor is defined by the overlap between the top electrode 140, the dielectric layer 120 and the bottom electrode 110. The varactor 100 in FIG. 1 is drawn with a specific shape for the electrodes 110, 140, dielectric layer 120 and active region 150. However, this is not meant as a limitation. FIG. 1 is intended to be a general depiction of a varactor 100 with electrodes 110, 140, dielectric layer 120 and active region 150. Furthermore, varactor 100 shows the most relevant layers 110, 120, 140, but this is not meant to imply that other layers do not exist. For example, additional layers located between those shown may be used for various purposes according to conventional techniques. Examples include layers to increase adhesion, to provide a diffusion barrier, or to improve the Schottky barrier height.

The dielectric layer 120 is voltage-variable in the sense that the dielectric material has a field-dependent electrical permittivity. Thus, the capacitance of the varactor can be changed by changing the voltage applied across the dielectric layer 120. By changing the voltage applied across the two electrodes 110,140, the electric field within the dielectric layer 120 is also changed. This, in turn, changes the dielectric constant of the dielectric layer 120, thus changing the capacitance of the varactor 100. This invention is not specific to a particular choice of dielectric material or film thickness or fabrication sequence. Examples of dielectric materials include ferroelectric materials. The dielectric layer 120 preferably exhibits a field-dependent permittivity in a (non-hysteretic) paraelectric state over a useful temperature range (e.g., −30C to +90C).

Two factors which can limit the performance of a varactor are the resistance of the varactor and the current handling capacity of the varactor. Higher resistance results in higher ohmic losses and also results in a lower operating bandwidth (e.g., due to a longer RC time constant). Lower current handling capacity limits the applications in which a varactor can be used.

In addition to the active region 150, electrodes also have a "bulk" region, which is the portion of the electrode away from the active region. Typically, the resistance of the bulk region is relatively insignificant relative to that of the active region. For example, if an electrode is narrow in the active region and then opens up into a wide area (e.g., a bonding pad), the wide area is part of the bulk region of the electrode and typically will have minimal resistance compared to the narrow portion.

In varactor 100, the active region of one or both electrodes 110,140 has a resistance that is significantly higher than the resistance of the bulk region of the electrode 110,140. For example, the active region of the electrode may be thinner than the bulk region or it may be made from a different material with lower conductivity. In both of these examples, the sheet resistance of the active region is significantly higher than that of the bulk region and, therefore, the overall resistance is also higher. Alternately, the active region and bulk region may have a similar sheet resistance but the lateral geometry causes the active region to have a significantly higher resistance compared to the bulk region. In any event, in varactor 100, the active region of the high-resistance electrode is a significant, if not dominant, contributor to the overall resistance of the varactor, resulting in the unwanted effects described previously.

Varactor 100 reduces these effects by increasing the "current conducting" perimeter of the active region 150 relative to the area of the active region. The "current conducting" perimeter is that portion of the perimeter which supports current flow between the active region and the rest of the electrode. For example, referring to electrode 110 in FIG. 1, the geometrical perimeter includes sides 152A–D. However, the current conducting perimeter only includes sides 152B–D and not side 152A. This is because, for electrode 110, current can flow from the active region 150 through sides 152B, C or D to the bulk of the electrode. However, there is no current path from the active region through side 152A.

Increasing the current conducting perimeter increases the number of current paths between the active region and the bulk of the electrode. The increased current conducting perimeter results in less resistance through the high resistance electrode (assumed to be electrode 110 in the above example) and therefore less resistance overall since the high resistance electrode makes a significant contribution to the overall resistance. The increased perimeter also results in better current handling capacity. The current conducting perimeter can be increased in a number of different ways and this effect can be quantified using a number of different measures.

In one approach, the effect is quantified by the ratio $$R = P/\text{sqrt}(A) \quad (1)$$

where P is the current conduction perimeter of the active region, A is the lateral area of the active region and sqrt( ) is the square root operator. For a square electrode in which the current conducting perimeter is one half of the geometrical perimeter, the ratio R=2.0. For comparison, a rectangular active region with a 2:1 aspect ratio in which half of the geometrical perimeter is current conducting has a ratio R=3/sqrt(2)=2.13. A circular active region with 50% conducting perimeter has a ratio R=sqrt($\pi$)=1.77. A square active region with three sides conducting has a ratio R=3.

One way to increase the current conducting perimeter for rectangular shaped active regions (assuming that the fraction of the geometrical perimeter that is current conducting remains constant) is to increase the aspect ratio of the rectangle. The use of long, narrow electrodes (and active regions) results in an increased perimeter compared to a more square shaped active region of the same area.

This effect is even more pronounced if the fraction of the geometrical perimeter that is current conducting also increases as the aspect ratio increases. For example, in one approach, two long sides and one short side of the rectangular active region are current conducting. The ratio R for this type of rectangular active region with aspect ratio m (i.e., the active region is L×mL where L is some length, m≧1) is given by $$R=(2m+1)/\sqrt{m} \qquad (2)$$

This function has a minimum at m=1 (i.e., square shaped active region) and increases with increasing m.

The active region can have shapes other than rectangular. For example, circular or disc-shaped active regions are sometimes used. However, rectangular active regions are generally easier to lay out and manufacture. In addition, they typically have more current conducting perimeter than a circular or disc-shaped active region of equal area.

Figure 2:
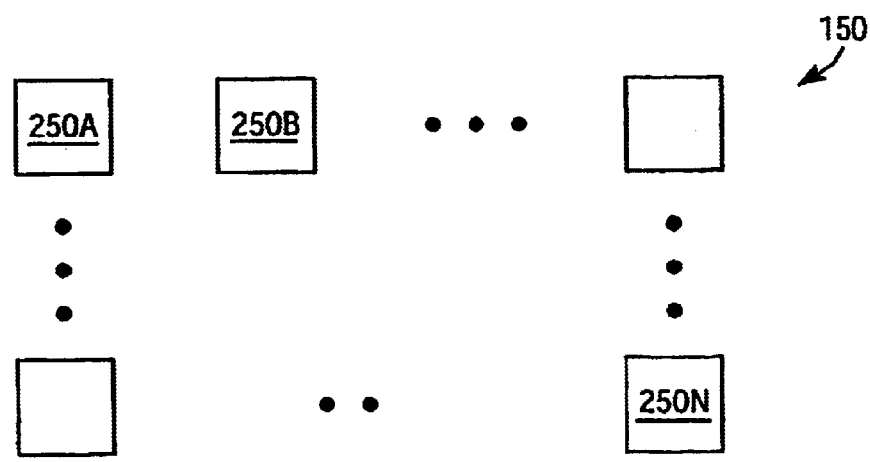
FIG. 2 is a top view of an active region having multiple cells.

Another way to increase the perimeter of an active region is to implement the active region as a number of disjoint subregions, which shall be referred to as cells. FIG. 2 is a top view of an active region 150 having N cells 250A–N. Each cell 250 behaves as a "mini varactor" and the multiple mini varactors are coupled in parallel to form the overall varactor. An active region made up of multiple cells generally will have a higher R ratio than a comparable active region made up of a single cell.

For example, assume that a one cell design has an area A, current conducting perimeter P and capacitance C. The corresponding $R=P/\sqrt{A}$. All else being equal, the capacitance C is directly proportional to the area A. Now assume that the capacitance C is implemented as an active region having N cells, each of which is the same shape and design as the original cell. Each cell is a $1/\sqrt{N}$ scaled version of the original cell. Therefore, each cell has an area of A/N and a current conducting perimeter of $P/\sqrt{N}$. The total area for all N cells is A (and therefore the capacitance is the same as for the one cell design) and the total current conducting perimeter is $P\sqrt{N}$. The corresponding $R=\sqrt{N} P/\sqrt{A}$. In other words, $$R(N)=\sqrt{N}R(1) \qquad (3)$$

where R(1) is the R ratio for the one cell design and R(N) is the R ratio for the N cell design. The R ratio has been increased by a factor of $\sqrt{N}$ by moving from a one cell active region to an N cell active region.

Both principles discussed above may be applied to a given design, although at times tradeoffs between the two may be required. For example, consider the design of a varactor with an active region of area $L^2$, L>1. Assume that the minimum feature size is 1. Table 1 shows four possible designs for this varactor, listed in increasing order of R ratio. In all of the designs, the cells are rectangular in shape and it is assumed that two long sides and one short side of each cell is current conducting.

TABLE 1

Four Designs for a Varactor of Area $L^2$

| Active Region | Total Area | Total Current Conducting Perimeter | R Ratio |
|---|---|---|---|
| 1 cell of dimension L × L | $L^2$ | 3L | 3 |
| 1 cell of dimension $L^2$ × 1 | $L^2$ | $(2L^2 + 1)$ | 2L + 1/L |
| L cells of dimension L × 1. | $L^2$ | L(2L + 1) | 2L + 1 |
| $L^2$ cells of dimension 1 × 1. | $L^2$ | $3L^2$ | 3L |

Table 1 is consistent with the general notion that it is preferable to have a larger number of cells, even if they are square in shape. The number of cells, however, can be constrained by other factors, for example limits in lithographic capability, current-handling considerations, and materials limitations. For example, in some cases where small capacitance values are required, the minimum realizable feature size may dictate that only single-cell designs are feasible. In this case, a long, narrow active region is preferred to an active region that is more square in shape. As another example, although long, narrow active regions are generally preferred, beyond a certain aspect ratio, incremental gains that result from further increasing the aspect ratio may be offset by other effects, for example increased resistance in the other electrode (i.e., the low resistance electrode). Generally speaking, significant gains can be realized by moving from an aspect ratio of 1:1 to 2:1, moderate gains for aspect ratios in the range of 2:1 to 10:1, and diminishing returns for aspect ratios beyond about 10:1. Hence, all other factors being equal, aspect ratios in the range of 2:1 to 10:1 are generally preferred.

In one implementation, the dielectric layer 120 is a thin film and the entire varactor is integrated on a substrate. Examples of suitable voltage-variable thin film materials include barium titanate, strontium titanate, and composites of the two (e.g., barium strontium titanate). The materials may also include small concentrations of one or more dopants to modify certain properties. Standard IC fabrication methods may be used to fabricate the integrated varactor. To reduce costs, inexpensive insulating substrates are usually preferred, including but not limited to high-resistivity silicon (HR Si), crystalline sapphire ($Al_2O_3$), aluminum nitride (AlN), quartz and glass. These substrates are polished for low surface roughness for compatibility with growth of smooth ferroelectric films with high breakdown fields. This approach results in low-cost, small size, reliable components which are suitable for mass production and for integration with other circuit elements.

Thin-film varactors can be used in a variety of applications such as radio-frequency (RF) or wireless electronics, voltage-controlled oscillators, impedance matching networks, tunable filters, and numerous other applications. A thin-film varactor is attractive because it can be easily integrated alongside other active and passive electrical components on many different host substrates, including semiconductors (such as silicon, gallium arsenide, silicon carbide, gallium nitride, etc.) and insulators (such as glass, quartz, sapphire, etc.). However, thin-film ferroelectric materials have a high intrinsic capacitance density, which means that typical capacitance values for RF circuit designs will be realized by small active regions. In addition, processing steps for ferroelectric materials can require conditions that limit the choice of materials for the electrode(s). High temperature processing may limit electrode materials to those with high melting points which also do not oxidize easily. Examples of such materials include platinum and other refractory metals such as palladium and tungsten, but generally exclude commonly used conductors such as gold, copper and aluminum. Unfortunately, these materials typically have higher resistivity and can also be quite expensive. This in turn can lead to high ohmic losses and high current densities. Hence, the principles described above for reducing resistance and current densities are especially suited for these devices.

As one example, these varactors can be used in RC tuning circuits for RF applications, such as mobile phones. While specific numbers will vary by application, 2:1 capacitance variations and capacitances in the range of 0.01 pF to 10 nF are not unheard of. Similarly, DC control voltages may be in the range of −100 to +100 volts, depending on the film thickness and the specific application. The varactors preferably are operated at voltages that are less than half their intrinsic breakdown voltage.

Figure 3:
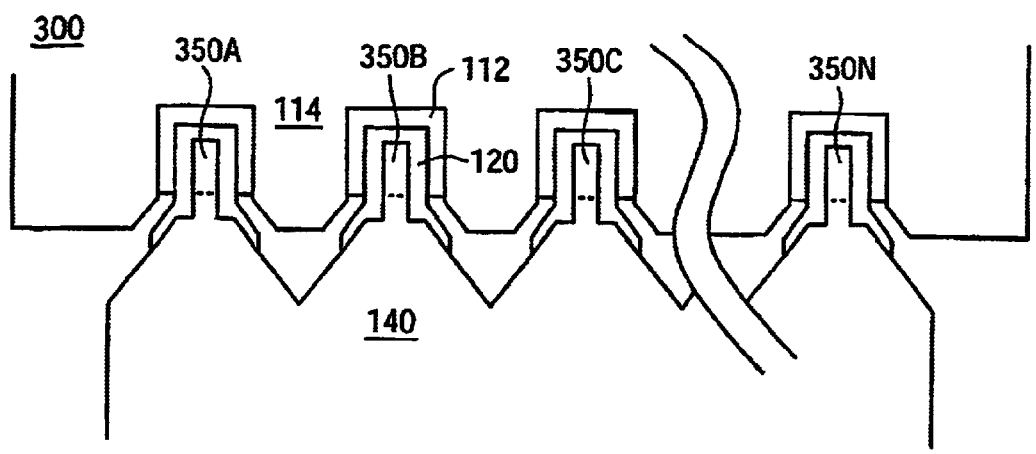
FIG. 3 is a top view of another varactor having multiple cells.

FIG. 3 is a top view of an example thin-film ferroelectric varactor 300 having multiple cells 350A–N. In this varactor, the ferroelectric layer 120 is a barium strontium titanate (BST) thin film. The bottom electrode has two parts which shall be referred to as the bottom electrode layer 112 and the bottom contact layer 114. These two layers 112, 114 are in electrical contact with each other. Each layer may include one or more types of materials, although they are shown and will be described as single layers of material in this example. The active region (i.e., each cell 350) is defined by the lateral overlap of the bottom electrode layer 112, the BST film 120 and the top electrode layer 140. The bottom electrode layer 112 is platinum in this example because it must be compatible with BST processing. The bottom contact layer 114 is a thick metal layer (e.g., gold) that provides electrical connection with reduced resistance to the bottom electrode layer 112. The top electrode 140 could be formed from the same thick metal layer or a separately deposited metal layer. In this example, it is assumed to be the same gold layer.

In FIG. 3, the full lateral extent of the top electrode 140 and the bottom contact layer 114 are visible. The BST film 120 is an eight-sided shape which is partially hidden by top electrode 140. Five of the eight sides are fully visible, two of the eight sides are partially visible and one side is obscured by top electrode 140. The bottom electrode layer 112 is rectangular in shape but extends beyond what is visible in FIG. 3. It is partially hidden by portions of the ferroelectric 120, bottom contact layer 114 and top electrode 140.

Figure 4A:
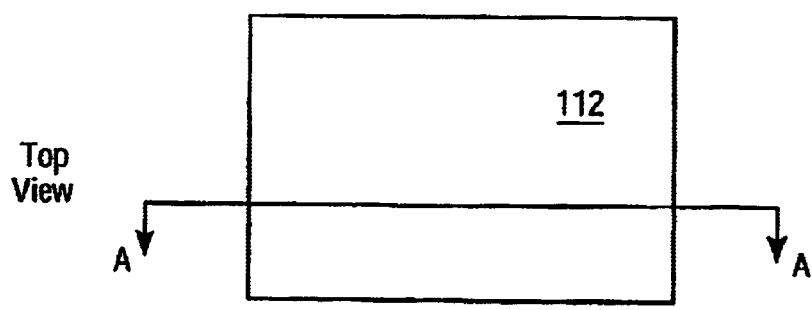
FIGS. 4A–4C are top view and cross-sectional view pairs, illustrating fabrication of one cell of the varactor of FIG. 3.
Figure 4A:
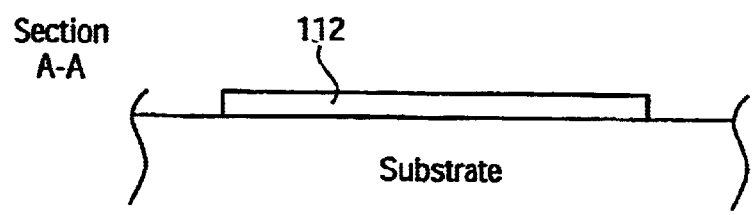
Figure 4B:
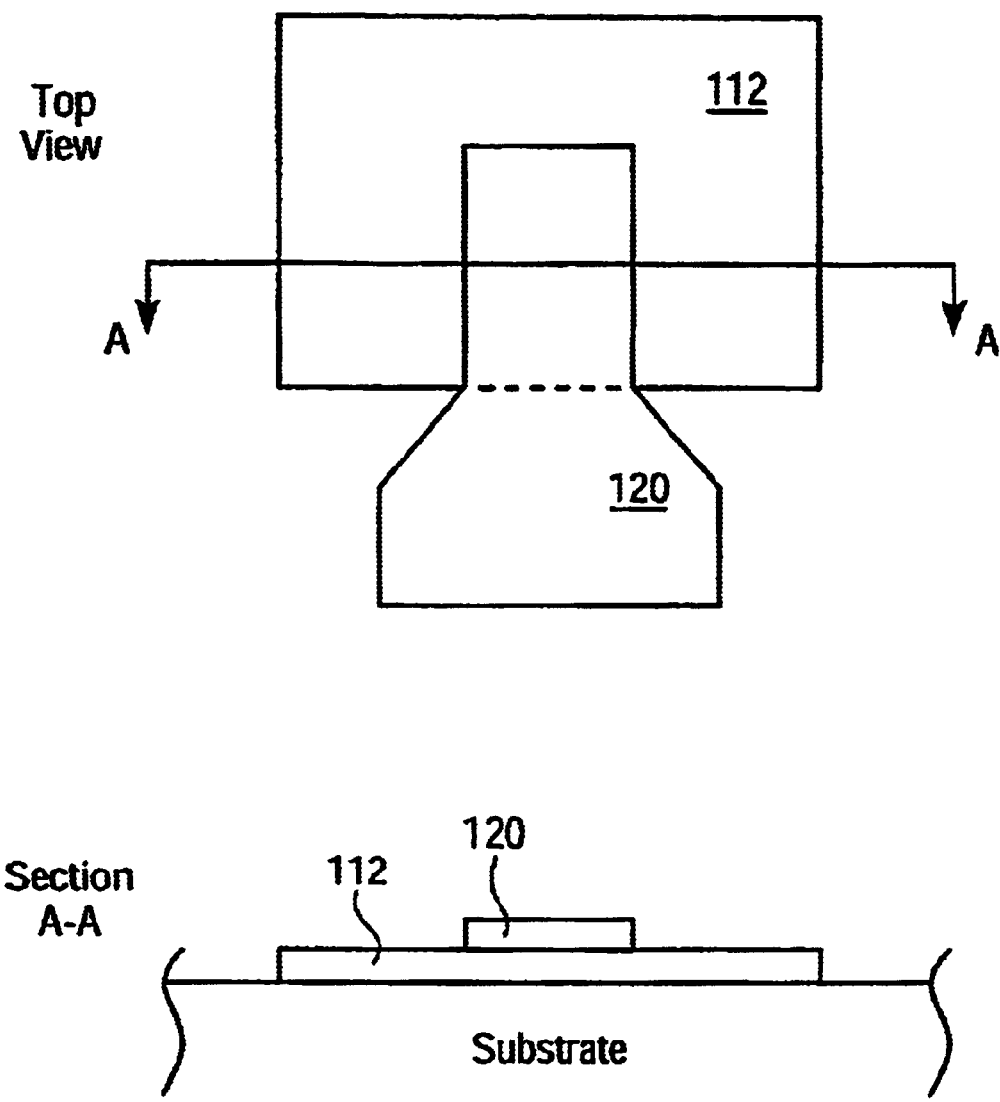
Figure 4C:
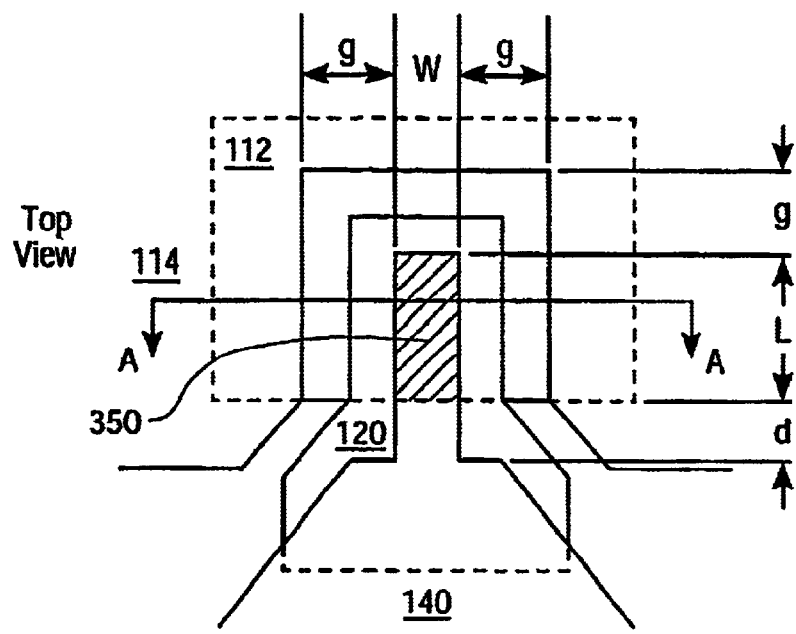
Figure 4C:
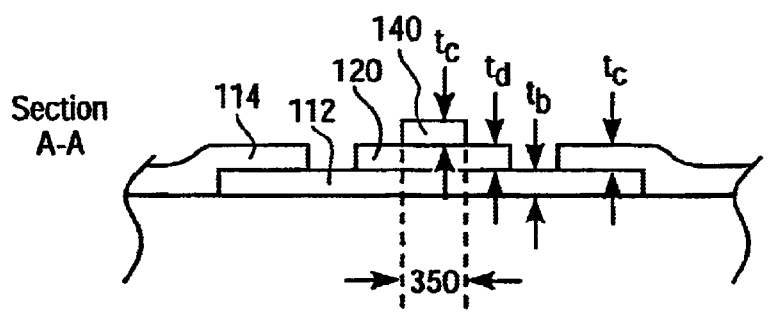

FIGS. 4A–4C are pairs of top view and cross-sectional view, illustrating fabrication of one cell 350 of varactor 300. In FIG. 4A, the bottom electrode layer 112 has been deposited on a substrate. In this example, layer 112 is a thin layer of platinum. Platinum is selected for compatibility with the BST processing and a thin layer is preferred since platinum is expensive. The layer 112 contains N disjoint subregions, each corresponding to one of the cells 350. In one approach, platinum is deposited across the entire substrate, the desired subregions are then masked, and the material in the unmasked regions are removed. What remains is the N subregions. In an alternate approach, a liftoff layer is deposited in areas other than the desired subregions, platinum is deposited across the substrate, and removal of the liftoff layer also removes the platinum from the unwanted areas. Other patterning techniques may be used.

In a next step, the BST film 120 is grown on top of the platinum layer 112. Conventional growth and patterning techniques may be used. Like layer 112, the BST film 120 contains N separate subregions, one for each cell 350. The film 120 overlaps the electrode layer 112. The result is shown in FIG. 4B. In the top view, the hidden portions of the bottom electrode layer 112 are shown by dashed lines.

In a final step, a gold layer is deposited and patterned to form both the top electrode 140 and the bottom contact layer 114 as shown in FIG. 4C. In the top view, the dashed lines indicate portions of the lower layers which are hidden by this gold layer. The bottom contact layer 114 overlaps with the bottom electrode layer 112, thus providing an electrical path to all of the disjoint subregions in layer 112. The gold layer 114,140 is thicker than the platinum layer 112 and gold is a better conductor than platinum. As a result, the platinum resistance is a significant, if not dominant, contribution to the overall resistance of the varactor.

The cells 350 making up the active region are rectangular in shape with dimension W×L in FIG. 4C. Each of the top electrode 140, bottom electrode layer 112 and BST film 120 entirely overlaps cell 350. Three sides of the cell 350 are defined by the top electrode 140. The fourth side is defined by the bottom electrode layer 112. The top electrode 140 and bottom contact layer 114 provide external contacts to the varactor. For example, they may lead to other circuit components or to external connections, such as bonding pads.

The top electrode 140 and bottom electrode (layers 112 and 114) preferably are thick and good conductors in order to reduce sheet resistance and current densities. However, in this particular example, bottom electrode layer 112 is relatively thin and a poor conductor (i.e., platinum), as a result of processing requirements imposed by the BST layer 120. However, the bottom contact layer 114 is relatively thick and a good conductor (gold). Thus, it is advantageous to place the bottom contact layer 114 in close proximity to the cells 350, in order to minimize the resistance resulting from the platinum layer 112. Top electrode 140 is also thick and a good conductor to minimize sheet resistance.

The use of multiple, narrow top electrodes 140 in close physical proximity to the bottom contact layer 114 results in a geometry with increased device perimeter for a given active area and with low resistance paths from the active region to external contacts. This geometry reduces ohmic losses and current densities in the device contacts, thus improving the electrical performance of the varactor. In particular, the layers are laid out so that the current conducting perimeter of the platinum layer 112 is relatively large. Two long sides and one short side of the rectangular active region are current conducting for a total current conducting perimeter of 2L+W for platinum layer 112.

Figure 5:
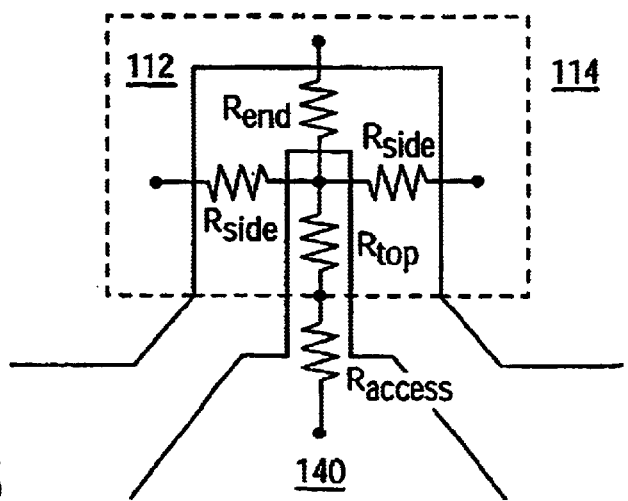
FIG. 5 is a diagram of a resistive model for the cell of FIG. 3.

FIG. 5 is a diagram of a resistive model for the cell 350. Resistances in the bulk regions of the bottom contact layer 114 and top electrode 140 are assumed to be negligible. Assuming that current flows from the top electrode 140 to the bottom contact layer 114, the current encounters the impedances shown in Table 2.

TABLE 2

Impedances in the Resistive Model of FIG. 5

| Symbol | Description | Expression |
|---|---|---|
| $R_{access}$ | Resistance from bulk of top electrode 140 to active area of top electrode | $R_{access} = r_t\, d/W$ |
| $R_{top}$ | Average resistance through active area of top electrode | $R_{top} = r_t\, L/(3W)$ |
| $Z_{varactor}$ | Impedance of ferroelectric material | $Z_{varactor} = 1/(y_d\, WL)$ |
| $R_{side}$ | Resistance from side of active area of bottom electrode layer 112 to bulk of bottom contact layer 114 | $R_{side} = r_b\, g/L$ |

TABLE 2-continued

Impedances in the Resistive Model of FIG. 5

| Symbol | Description | Expression |
|---|---|---|
| $R_{end}$ | Resistance from end of active area of bottom electrode layer 112 to bulk of bottom contact layer 114 | $R_{end} = r_b\, g/W$ | where $r_t$ = sheet resistance of top electrode 140 (in $\Omega$/square)
$r_b$ = sheet resistance of bottom electrode layer 112 (in $\Omega$/square)
$y_d = g_d + jax_d$ = admittance density of BST film 120
$g_d$ = ferroelectric conductance density (S/m$^2$)
$c_d$ = ferroelectric capacitance density (F/m$^2$).

Quantities d, W, L and g are the lengths shown in FIG. 5. Specifically, cell 350 is defined by the rectangle with width W and length L. The length g is the distance from the cell 350 to the bulk of bottom contact layer 114. The distance d is the distance from the cell 350 to the bulk of top electrode 140.

An approximate expression for the impedance of the cell 350 is then $$Z_{in} \approx \underbrace{\frac{r_t}{W}\left(d+\frac{L}{3}\right)+r_b\frac{g}{2L+W}}_{R_S} + \frac{1}{y_d W L} \quad (4)$$

$R_S$ is the equivalent series resistance for the cell. The series resistance consists of $R_{access}$ and $R_{top}$ coupled in series with the parallel combination of $R_{side}$, $R_{end}$ and $R_{side}$. The resistance contribution from the bottom electrode layer 112 is usually the dominant term due to the materials and thickness differences described above. Furthermore, this model highlights the important feature that the resistance contribution from the bottom electrode layer 112 is a direct function of the quantity 2L+W, which is the current conducting perimeter. Thus, the series resistance of the cell can be reduced by increasing the current conducting perimeter.

Considering only electrode losses (i.e., assuming gd=0), the cutoff frequency for the cell is given by $$fc = 1/(2\pi R_S c_d A) \quad (5)$$

where A is the area of the cell. The cutoff frequency is a measure of performance. Higher cutoff frequencies are usually preferred. Assuming the series resistance is dominated by the contribution from the bottom electrode layer 112, the cutoff frequency is approximately $$f_c \approx \frac{1}{2\pi r_b c_d g}\left(\frac{2L+W}{A}\right) \quad (6)$$

showing the dependence on the current conducting perimeter and on the perimeter to area ratio. Thus, to realize a varactor with a high cutoff frequency (i.e., a low series resistance), devices with large R ratios and/or current conducting perimeters are preferred. The R ratio and/or current conducting perimeter can be increased using the techniques described previously, for example by increasing the aspect ratio of the cells and/or by increasing the number of cells. Note that the cutoff-frequency of N identical capacitors connected in parallel is the same as that of the individual capacitors. Thus a multiple-contact geometry like that shown in FIG. 3 can provide low resistive loss and high cutoff frequency for a given varactor capacitance.

For example, if a varactor has N cells, each of which is W×L as shown in FIG. 3, then the total area of the active region will be A=NWL. The N cells are connected in parallel, so the total resistance for the varactor will be 1/N of the resistance for one cell. Referring to Eqn. 4, dividing the expression for the series resistance by N and making use of the equation A=NWL yields a total series resistance of $$R_s = \frac{r_t L}{A}\left(d+\frac{L}{3}\right) + \frac{r_b g L}{2NL^2 + A} \quad (7)$$

Figure 6:
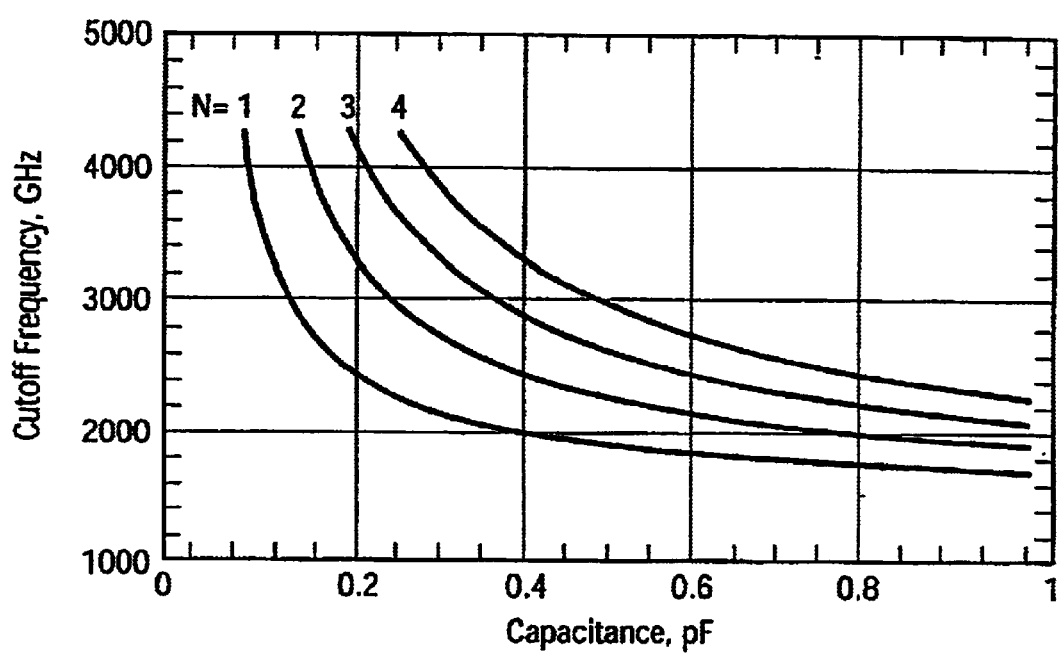
FIG. 6 is a graph of cutoff frequency for the varactor of FIG. 3 as a function of capacitance and of number N of cells.

FIG. 6 is a graph of cutoff frequency for the varactor of FIG. 3 as a function of capacitance and of the number N of cells, for N=1, 2, 3, and 4. The cells are assumed to be the same shape for all designs. In this example, if a 0.2 pF capacitor were desired, FIG. 6 shows that the cutoff frequency can be increased by 75% using a three-cell design instead of a one-cell design.

Current handling is another factor that limits the performance of varactors. If the electrodes are made from metal films, there are two failure mechanisms which typically will limit the current densities in the electrodes. One is electromigration failures, in which momentum transfer from the mobile charges to the metal atoms is sufficient to tear the material apart. The other is Joule heating, in which high current densities create large thermal gradients that degrade the metal or neighboring materials. In each case, the current density J in the metal film must be kept below some critical value $J_c$. The value $J_c$ varies according to the type of metal, the method of deposition, and the local environment. Mathematically, $$J < J_c \quad (8)$$

$J_c$ may be on the order of $10^6$ A/cm$^2$. The amount of AC current that will flow in the varactor is a function of the RF voltage and impedance. If the peak AC voltage swing is denoted by $V_{max}$, the peak AC current is $$I_{max} = j\chi C V_{max} \quad (9)$$

For the cell of FIG. 3, Eqn. 9 implies the following inequalities for the top and bottom electrodes, respectively $$\frac{I_{max}}{t_c W} < J_c \quad \frac{I_{max}}{t_b(2L+W)} < J_c \quad (10)$$

where $t_c$ and $t_b$ are the thicknesses of the top electrode 140 and bottom electrode layer 112, respectively.

According to the first inequality in Eqn. 10, the width W must satisfy $$W > W_{min} = \frac{I_{max}}{t_c J_c} \quad (11)$$

The constraint on length L is slightly more complicated since the current density in the bottom contact is set by the quantity (2L+W), and also since the length-width product LW=A is set by the desired capacitance value of the cell. Substituting W=A/L in the second inequality in Eqn. 10 and then manipulating results in $$2L + \frac{A}{L} - \frac{I_{max}}{t_b J_c} > 0 \quad (12)$$

This inequality will be satisfied by large values of L (in which case the 2L term is large) or for small values of L (in which case the A/L term is large). However, the small value solutions typically are less interesting because they represent the case where two short sides and one long side of a rectangular cell are current conducting (i.e., the case where L in FIG. 4C is small and W is large). A valid cell design has values of W and L that satisfy Eqns. 11 and 12 as well as the equality LW=A, where A is set by the desired capacitance of the cell. There is no guarantee that a valid cell design exists.

The quantity on the left in Eqn. 12 can be thought of as the "excess" current conducting perimeter beyond what is needed to keep the current density in the bottom electrode below the threshold current density. It is a measure of how close to the current handling limit the varactor design is. The larger the quantity, the farther away from the limit is the design. There is no guarantee that there is a realizable length in the range $L<L_{max}=A/W_{min}$ that will satisfy Eqn. 12. If there is not, one possible solution is to increase the metal thicknesses until a realizable design is achieved. However, the bottom electrode layer 112 is typically made from an expensive refractory material such as platinum. Hence, it is desirable to minimize the electrode thickness in order to reduce the amount of expensive metal required. It is also desirable to keep this thickness small in order to avoid lithography problems resulting from non-planar topology.

Hence, the approach described above is an attractive alternate solution. That is, the current density can be reduced by increasing the current conducting perimeter of the active region, while maintaining the same area. One way to do this is to increase the number of cells. If there are N cells, then the area and peak current in each cell is reduced by 1/N. Therefore, Eqn. 12 becomes $$2L + \frac{A}{NL} - \frac{I_{max}}{t_b J_c N} > 0 \quad (13)$$

Figure 7A:
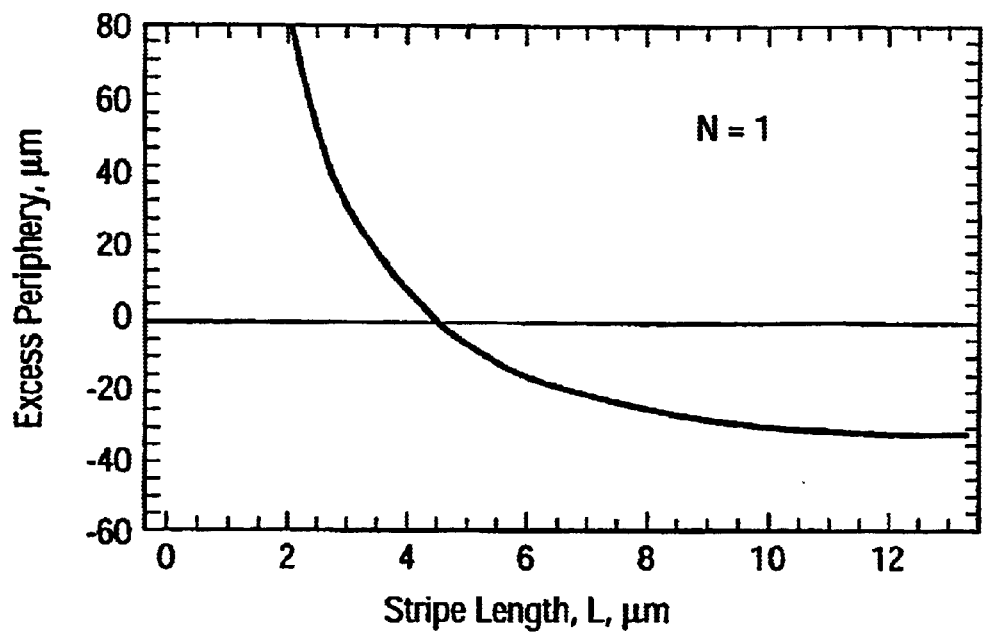
FIGS. 7A and 7B are graphs of excess current conducting perimeter as a function of electrode length for N=1 and N=4 cells, respectively.
Figure 7B:
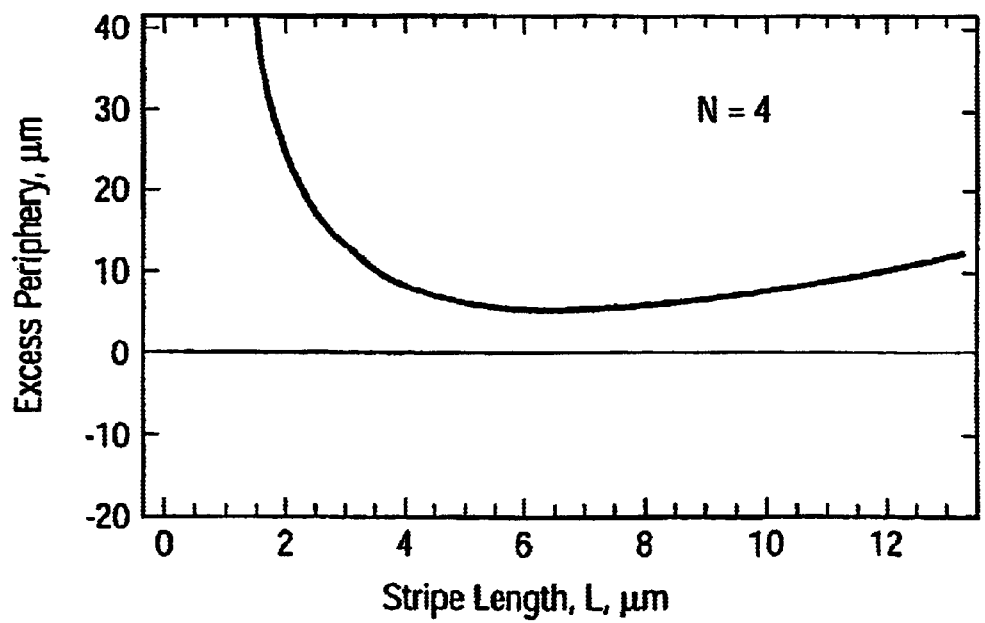

FIGS. 7A and 7B are graphs of excess current conducting perimeter (i.e., the lefthand side of Eqn. 13) as a function of length L for N=1 and N=4 cells, respectively. These graphs are plotted only for values of L which satisfy the inequality $L<L_{max}=A/W_{min}$. In other words, the graphs plot the excess current conducting perimeter only for allowable values of stripe length L. In order to be a valid cell design, the excess perimeter must be greater than zero (Eqn. 13) and the resulting cell design must also have acceptable resistive loss (generally, lower resistive losses are achieved by higher values of L, as discussed previously). In FIG. 7A, the only values of L which satisfy Eqn. 13 are low values of L, but these probably have unacceptable resistive loss. Thus, it is likely that an acceptable 1-cell design does not exist. In FIG. 7B, larger stripe lengths also satisfy Eqn. 13, suggesting that a valid 4-cell design likely does exist.

Although the invention has been described in considerable detail with reference to certain preferred embodiments thereof, other embodiments will be apparent. For example, the shapes of the top and bottom electrodes in FIG. 3 could be switched. As another example, the electrodes and active regions can take shapes other than rectangular, for example circular, semicircular or serpentine. In these cases, the design objective of increasing perimeter would still favor the use of multiple cells, but the exact resistive model and design equations would be different than those presented herein although the principles illustrated would still be applicable. As a final example, it is not necessary that all cells have exactly the same size and shape. A mix of cells of different dimensions and/or shapes could also be used to increase the varactor perimeter. Therefore, the scope of the appended claims should not be limited to the description of the preferred embodiments contained herein.

What is claimed is:

1. A parallel plate varactor comprising:
   a bottom electrode;
   a top electrode;
   a dielectric layer sandwiched between the bottom electrode and the top electrode, wherein
      a permittivity of the dielectric layer varies according to an electric field applied to the dielectric layer; the bottom electrode, dielectric layer, and top electrode are integrated on a substrate; and an overlap between the bottom electrode, dielectric layer, and top electrode defines an active region for the varactor; and wherein, for at least one of the electrodes:
      a resistance of said electrode is a significant portion of an overall resistance of the varactor;
      said electrode includes an electrode layer that includes the active region and extends laterally beyond the active region;
      a sheet resistance of the electrode layer is significantly higher than a sheet resistance of a bulk region of said electrode;
      the active region of said electrode has an area A, said electrode has a current conducting perimeter P for current flow between the active region and the bulk region; and a ratio R of the perimeter P to a square root of the area A is at least 2.0.

2. The parallel plate varactor of claim 1 wherein the active region consists of exactly one cell.

3. The parallel plate varactor of claim 1 wherein the active region comprises at least two cells.

4. The parallel plate varactor of claim 3 wherein the cells are a same shape and size.

5. The parallel plate varactor of claim 1 wherein:
   the active region comprises at least one cell, each cell having a rectangular shape with an aspect ratio of at least 2:1; and
   for each cell, the current conducting perimeter of said electrode is at least one half of the geometrical perimeter of the cell.

6. The parallel plate varactor of claim 1 wherein:
   the active region comprises at least one cell, each cell having a rectangular shape; and
   for each cell, the current conducting perimeter of said electrode includes at least three sides of the cell.

7. The parallel plate varactor of claim 1 wherein:
   the active region comprises at least one cell, each cell having a rectangular shape;
   the at least one electrode includes the bottom electrode;
   the electrode layer of the bottom electrode has a higher sheet resistance than the active region of the top electrode; and
   for each cell, the current conducting perimeter of the bottom electrode includes at least three sides of the cell and the current conducting perimeter of the top electrode includes a fourth side of the cell.

8. The parallel plate varactor of claim 1 wherein the dielectric layer comprises a ferroelectric thin film layer.

9. The parallel plate varactor of claim 8 wherein the ferroelectric thin film layer comprises at least one of the materials selected from a group consisting of: barium titanate (BT), strontium titanate (STO), and barium strontium titanate (BST).

10. The parallel plate varactor of claim 1 wherein the dielectric layer comprises a non-ferroelectric thin film layer.

11. The parallel plate varactor of claim 1 wherein the electrode layer of said electrode comprises a refractory metal.

12. The parallel plate varactor of claim 11 wherein the refractory metal comprises platinum.

13. The parallel plate varactor of claim 1 wherein:

the active region comprises at least one cell and the cell(s) are a same rectangular shape and size;

the dielectric layer comprises at least one of the materials selected from a group consisting of: barium titanate, strontium titanate and barium strontium titanate;

the at least one electrode includes the bottom electrode, and the electrode layer of the bottom electrode comprises platinum; and the electrode layer of the bottom electrode has a higher sheet resistance than the active region of the top electrode.

14. The parallel plate varactor of claim 13 wherein an aspect ratio of the rectangular shape is at least 2:1 and, for each cell, the current conducting perimeter of the bottom electrode is at least one half of the geometrical perimeter of the cell.

15. The parallel plate varactor of claim 13 wherein, for each cell, the current, conducting perimeter of the bottom electrode includes at least three sides of the cell.

16. The parallel plate varactor of claim 1 wherein:

the top electrode comprises a top electrode layer that includes the active region;

the at least one electrode includes the bottom electrode; and the bottom electrode further comprises:

a bottom contact layer in electrical contact with the electrode layer of the bottom electrode; and wherein the top electrode layer and the bottom contact layer are formed from a same metal layer.

17. The parallel plate varactor of claim 16 wherein:

the active region comprises at least two cells;

the bottom electrode layer comprises disjoint subregions, each disjoint region including one of the cells of the active region; and the bottom contact layer electrically connects all of the disjoint subregions of the bottom electrode layer.

18. The parallel plate varactor of claim 1 wherein the varactor is adapted for use in RF circuitry.

19. The parallel plate varactor of claim 13 wherein, for each cell, the current conducting perimeter of the bottom electrode includes at least three sides of the cell and the current conducting perimeter of the top electrode includes a fourth side of the cell.

20. The parallel plate varactor of claim 13 wherein the top electrode comprises a top electrode layer that includes the active region; and the bottom electrode further comprises:

a bottom contact layer in electrical contact with the electrode layer of the bottom electrode; and wherein the top electrode layer and the bottom contact layer are formed from a same metal layer.

* * * * *